(12) United States Patent
Lim et al.

(10) Patent No.: US 10,806,022 B2
(45) Date of Patent: Oct. 13, 2020

(54) FLUID HEATING HEATER

(71) Applicant: Hanon Systems, Daejeon (KR)

(72) Inventors: Cha You Lim, Daejeon (KR); Hyun Seok Jung, Daejeon (KR)

(73) Assignee: Hanon Systems, Daejeon (KR)

( * ) Notice: Subject to any disclaimer, the term of this patent is extended or adjusted under 35 U.S.C. 154(b) by 0 days.

(21) Appl. No.: 16/533,923

(22) Filed: Aug. 7, 2019

(65) Prior Publication Data

US 2020/0053866 A1 Feb. 13, 2020

(30) Foreign Application Priority Data

Aug. 9, 2018 (KR) .................. 10-2018-0093049
Aug. 9, 2018 (KR) .................. 10-2018-0093052
Sep. 14, 2018 (KR) .................. 10-2018-0110295

(51) Int. Cl.
| | |
|---|---|
| *H05K 1/02* | (2006.01) |
| *H05K 5/02* | (2006.01) |
| *H05K 5/00* | (2006.01) |
| *B60H 1/22* | (2006.01) |
| *F24H 1/10* | (2006.01) |

(52) U.S. Cl.
CPC ......... *H05K 1/0207* (2013.01); *B60H 1/2221* (2013.01); *F24H 1/105* (2013.01); *H05K 5/0004* (2013.01); *H05K 5/02* (2013.01)

(58) Field of Classification Search
CPC .. H05K 1/0207; H05K 1/0272; H05K 1/0212; H05K 5/0004; H05K 5/02; H05K 7/20009–20336; H05K 7/20872; H05K 2201/10151; H05K 2201/10189; B60H 1/00–22; B60H 1/2221; H05B 3/24; F24H 1/105

USPC ......................................................... 392/494
See application file for complete search history.

(56) References Cited

U.S. PATENT DOCUMENTS

| | | | | |
|---|---|---|---|---|
| 6,839,509 | B2 * | 1/2005 | Kuebler | B60S 1/488 137/334 |
| 9,161,391 | B2 * | 10/2015 | Niederer | H05B 3/24 |
| 2008/0000889 | A1 * | 1/2008 | Niederer | F24H 3/0464 219/205 |
| 2014/0037277 | A1 * | 2/2014 | Kominami | F24H 1/142 392/482 |
| 2017/0295613 | A1 * | 10/2017 | Kim | B60H 1/00392 |

(Continued)

FOREIGN PATENT DOCUMENTS

KR 10-2018-0075777 * 12/2016

OTHER PUBLICATIONS

English Machine Translation of Woory (KR 10-2018-0075777) provided with Office Action (Year: 2018).*

(Continued)

*Primary Examiner* — Roshn K Varghese
(74) *Attorney, Agent, or Firm* — Norton Rose Fulbright US LLP; James R. Crawford

(57) ABSTRACT

An embodiment discloses a fluid heating heater including: a main body including a plate-shaped partition part, and a flow path forming part forming a flow path in the other surface of the partition part; a heating plate disposed on the flow path forming part in a plate shape, and including a heating pattern having a shape corresponding to the flow path; a circuit board disposed on one surface of the partition part; and a bus bar configured to electrically connect the heating pattern and the circuit board.

15 Claims, 18 Drawing Sheets

(56) References Cited

U.S. PATENT DOCUMENTS

2019/0319551 A1* 10/2019 Song .................... H02M 7/003
2020/0039324 A1* 2/2020 Adachi ................ B60H 1/2218

OTHER PUBLICATIONS

Original Woory (KR 10-2018-0075777) provided with Office Action (Year: 2018).*

* cited by examiner

230

FLUID HEATING HEATER

CROSS-REFERENCE TO RELATED APPLICATION

This application claims priority to and the benefit of Korean Patent Applications No. 2018-0093049, filed on Aug. 9, 2018, No. 2018-0093052, filed on Aug. 9, 2018, and No. 2018-0110295, filed on Sep. 14, 2018, the disclosure of which is incorporated herein by reference in its entirety.

BACKGROUND

1. Field of the Invention

An embodiment relates to a fluid heating heater.

2. Discussion of Related Art

Currently, the most general vehicle uses an engine as a driving source. The engine uses gasoline, diesel, or the like as an energy source, but the energy source has various problems such as petroleum deposit reduction and the like in addition to environmental pollution. Accordingly, the necessity of new energy sources gradually rises, and vehicles using the new energy sources such as electric vehicles or the like have been developed or commercialized.

However, since the electric vehicle or the like does not have a heat source configured to generate a lot of heat such as an engine, a heat source used in an air conditioner for a vehicle has to be additionally installed.

A heat source additionally installed in a conventional electric vehicle or the like includes a heat pump, an electric heater, and the like, and the electric heater among the above can be applied without largely changing a design of a conventional air conditioner, and thus has been widely used. The electric heater is roughly classified into an air heating heater which directly heats air blown into the interior of the vehicle, and a fluid heating heater (or a cooling water heater) which indirectly heats the air by heating cooling water which heat-exchanges with the air.

SUMMARY OF THE INVENTION

An embodiment is directed to providing a fluid heating heater configured to maximally expand an overlapping area between a fluid and a heat generation body and capable of minimizing a product size.

The embodiment is directed to providing a fluid heating heater capable of preventing a gap between a heating plate and an electrical terminal.

However, a problem desired to be solved by the present disclosure is not limited to the above, and also includes purposes or effects understood from the following solution of the problem or an embodiment.

According to an aspect of the present disclosure, there is provided a fluid heating heater including: a main body including a plate-shaped partition part, and a flow path forming part forming a flow path in the other surface of the partition part; a heating plate disposed on the flow path forming part in a plate shape, and including a heating pattern having a shape corresponding to the flow path; a circuit board disposed on one surface of the partition part; and a bus bar configured to electrically connect the heating pattern and the circuit board.

The fluid heating heater may include a first cover disposed on the one surface of the partition part; and a second cover disposed on the other surface of the partition part. The main body may include a first sidewall portion disposed on the one surface of the partition part and a second sidewall portion disposed on the other surface of the partition part, the first cover may be coupled to the first sidewall portion, and the second cover may be coupled to the second sidewall portion.

The flow path forming part may be disposed at an inner side of the second sidewall portion.

The main body may include an inlet and an outlet configured to pass through the partition part from the outside of the first sidewall portion, and the flow path may extend from the inlet to the outlet.

The fluid heating heater may include a pair of water temperature sensors configured to pass through the partition part from the inside of the first sidewall portion to be respectively disposed in a pair of insertion holes connected to the flow path.

The pair of insertion holes may be disposed at positions corresponding to the inlet and the outlet, respectively.

The first sidewall portion may include a first-first sidewall and a first-second sidewall facing each other, and a first-third sidewall and a first-fourth sidewall configured to connect the first-first sidewall and the first-second sidewall and face each other, an inner side surface of the first-first sidewall may include a pair of inclined surfaces which are inclined with respect to one surface of the partition part, and the pair of insertion holes may be respectively disposed in the pair of inclined surface.

The insertion holes may extend in a direction vertical to the inclined surface.

A height of each of the first-third sidewall and the first-fourth sidewall may decrease as distances thereof from the first-first sidewall increase.

A height of the first-second sidewall may be smaller than a height of the first-first sidewall.

The fluid heating heater may include a first connector and a second connector which pass through the first-first sidewall to electrically connect an external power source and the circuit board.

The first connector and the second connector may be disposed between the pair of inclined surfaces.

The flow path forming part may include a plurality of straight portions which are disposed in parallel to each other, and a plurality of curved portions configured to connect the plurality of straight portions, and the inlet and the outlet may be disposed at a first end of the straight portion.

The plurality of curved portions may include a plurality of first curved portions configured to sequentially connect second ends of the odd-numbered straight portions which are adjacent thereto among the plurality of straight portions, and a plurality of second curved portions configured to sequentially connect first ends of the even-numbered straight portions which are adjacent thereto among the plurality of straight portions.

A maximum distance from the first end of the straight portion to the inlet and the outlet may be greater than a maximum distance from the first end of the straight portion to the second curved portion, with respect to a direction parallel to the straight portion.

The heating plate may include a metal plate including one surface which comes into contact with the flow path, a first insulation layer disposed on the other surface of the metal plate, the heating pattern disposed on the first insulation layer, and a second insulation layer configured to surround the heating pattern.

The circuit board may be coupled to a plurality of posts configured to protrude from the one surface of the partition part and may be disposed to be spaced apart from the one surface of the partition part.

The fluid heating heater may include electronic elements disposed in a seating groove or on a platform formed at the one surface of the partition part.

The seating groove or the platform may overlap the flow path in a direction passing through the partition part.

The seating groove or the platform may overlap the inlet in an extending direction of the flow path.

The electronic element may include an insulated gate bipolar mode transistor (IGBT) connected to the circuit board.

According to another aspect of the present disclosure, there is provided a fluid heating heater including: a main body including a plate-shaped partition part, and a flow path forming part forming a flow path in the other surface of the partition part; a heating plate disposed on the flow path forming part in a plate shape, and including a heating pattern having a shape corresponding to the flow path; a circuit board disposed on one surface of the partition part to control heat generation of the heating pattern; a bus bar including a first terminal disposed at one end portion of the heating pattern, and a second terminal configured to connect the first terminal and the circuit board; and a fixing member configured to prevent the first terminal from separating from the heating pattern The fluid heating heater may include a second cover disposed on the other surface of the partition part. The main body may include a second sidewall portion disposed at the other surface of the partition part and to which the second cover is coupled, the heating plate may include a metal plate including one surface which comes into contact with the flow path, a first insulation layer disposed on the other surface of the metal plate, and the heating pattern disposed on the first insulation layer, the first terminal may be disposed on the heating pattern, and the fixing member may be coupled to the second cover to be disposed on the first terminal.

The fixing member may press the first terminal toward the heating plate.

The first terminal may include a first-first horizontal portion disposed on the heating pattern, a first vertical portion bent from the first-first horizontal portion in a direction vertical to the other surface of the metal plate, and a first-second horizontal portion bent from the first vertical portion in a direction opposite the first-first horizontal portion.

The fixing member may be disposed on the first-first horizontal portion.

The first-second horizontal portion may be disposed on the second terminal.

The second terminal may include a second vertical portion inserted into a slot of the circuit board, a second horizontal portion facing the first-second horizontal portion, and a connection part bent from the second vertical portion and the second horizontal portion.

The connection part may be disposed to be inclined with respect to the second vertical portion and the second horizontal portion.

A plurality of heating patterns may be disposed in parallel, and at least one first terminal may be disposed on each of the plurality of heating patterns.

One fixing member may be disposed on the plurality of first terminals, and the fixing member may include an elastic layer disposed on an end portion to compensate for a difference of heights of the plurality of first terminals.

One second terminal may be disposed on each of the plurality of first terminals, and the bus bar may include a bus bar frame to which the plurality of second terminals are coupled.

The bus bar frame may include a plurality of protruding parts respectively inserted into a plurality of connection holes configured to pass through the partition part.

According to still another aspect of the present disclosure, there is provided a fluid heating heater including: a main body including a plate-shaped partition part, and a flow path forming part forming a flow path in the other surface of the partition part; a heating plate disposed on the flow path forming part in a plate shape, and including a heating pattern having a shape corresponding to the flow path; a circuit board disposed on one surface of the partition part to control heat generation of the heating pattern; and a bus bar including a terminal disposed on the heating pattern to be connected to the circuit board, and a bus bar frame fixed to the heating plate to prevent the terminal from separating from the heating pattern The bus bar frame may press the terminal toward the heating pattern.

The terminal may include a vertical portion having one end connected to the circuit board, a first horizontal portion configured to horizontally extend from the other end of the vertical portion, a second horizontal portion disposed on an end portion of the heating pattern, and a connection part bent from the first horizontal portion and the second horizontal portion.

The connection part may be disposed to be inclined with respect to the first horizontal portion and the second horizontal portion.

The bus bar frame may include a frame main body configured to surround the vertical portion, and a cantilever configured to horizontally extend from the frame main body to be disposed on the second horizontal portion.

The second horizontal portion may be disposed between the heating pattern and the cantilever.

The cantilever may press the second horizontal portion toward the heating pattern.

The cantilever may include a first area configured to surround the first horizontal portion, a second area in which a groove configured to expose the connection part is formed, and a third area disposed on the second horizontal portion.

The cantilever may be disposed on the heating plate at the first area.

The cantilever may have a smaller thickness at the second area in comparison with the first area and the third area.

A plurality of fastening holes into which fastening members fastened to the heating plate are inserted may be formed in the frame main body.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, preferable embodiments of the present disclosure will be described in detail with reference to the accompanying drawings.

However, the technical spirit of the present disclosure is not limited to some embodiments which will be described and may be embodied in various forms, and one or more elements in the embodiments may be selectively combined and replaced to be used within the scope of the technical spirit of the present disclosure.

Further, terms used in the embodiments of the present disclosure (including technical and scientific terms), may be interpreted with meanings that are generally understood by those skilled in the art unless particularly defined and described, and terms which are generally used such as terms defined in a dictionary may be understood in consideration of their contextual meanings in the related art.

In addition, terms used in the description are provided not to limit the present disclosure but to describe the embodiments In the specification, the singular form may also include the plural form unless the context clearly indicates otherwise, and may include one or more of all possible combinations of A, B, and C when disclosed as at least one (or one or more) of "A, B, and C".

In addition, terms such as first, second, A, B, (a), (b), and the like may be used to describe elements of the embodiments of the present disclosure.

The terms are only provided to distinguish the elements from other elements, and essentials, sequences, orders, or the like of the elements are not limited by the terms.

Further, when particular elements are disclosed as being 'connected', 'coupled', or 'linked' to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction with respect to one element may be included.

Figure 1:
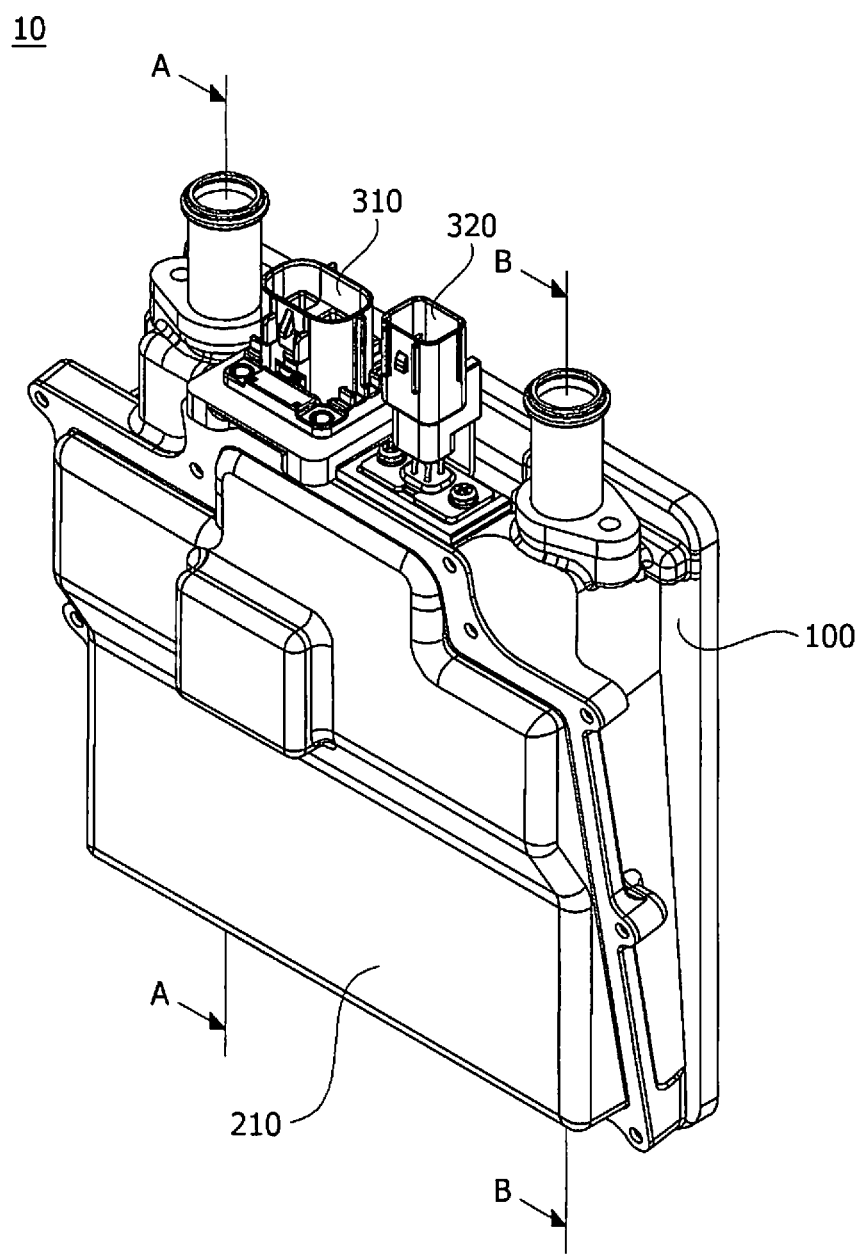
FIG. 1 is a perspective view of a fluid heating heater according to an embodiment of the present disclosure.
Figure 2:
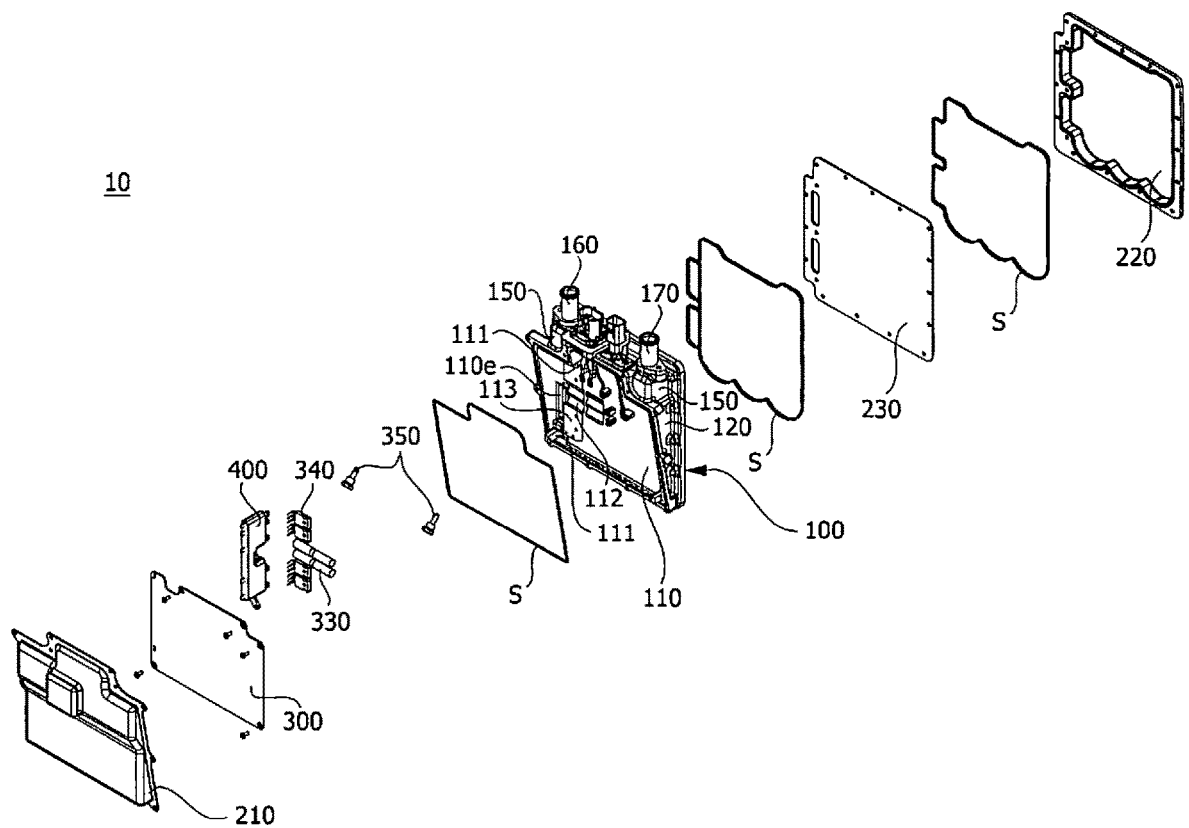
FIGS. 2 and 3 are exploded perspective views of FIG. 1.
Figure 3:
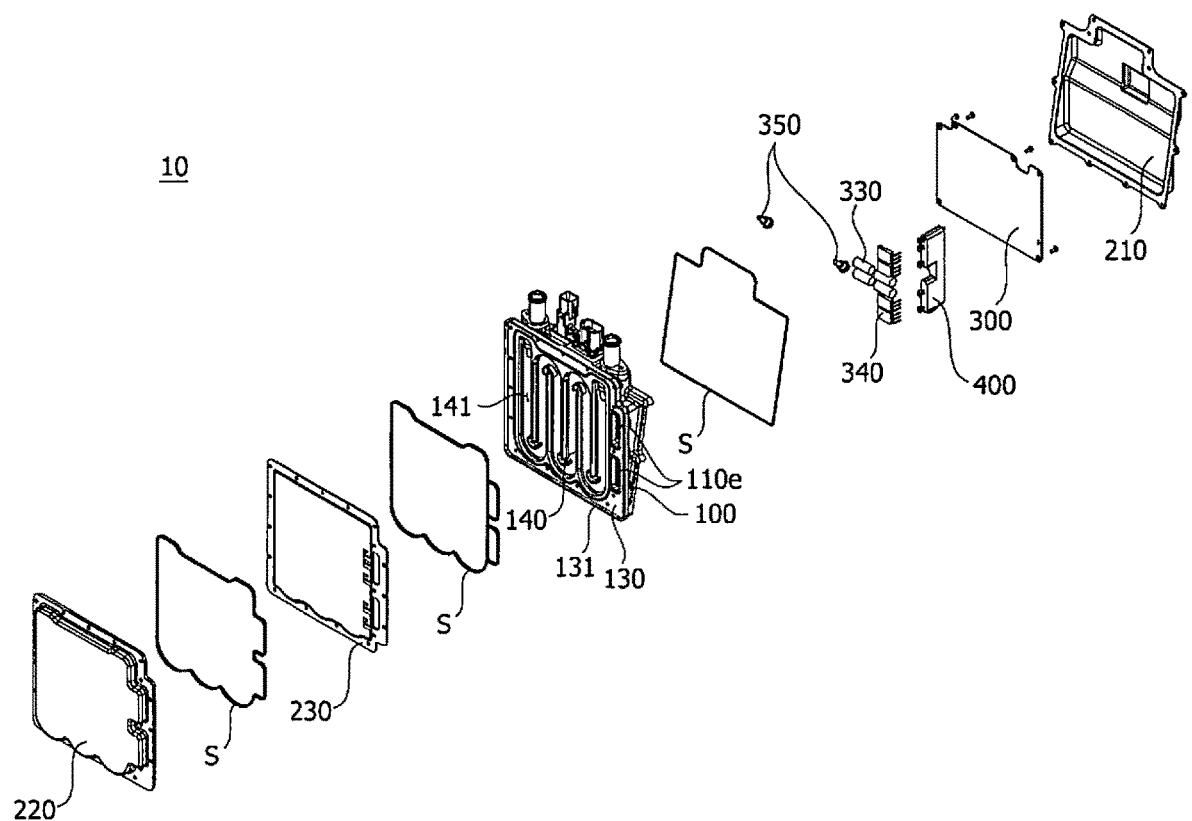
Figure 4:
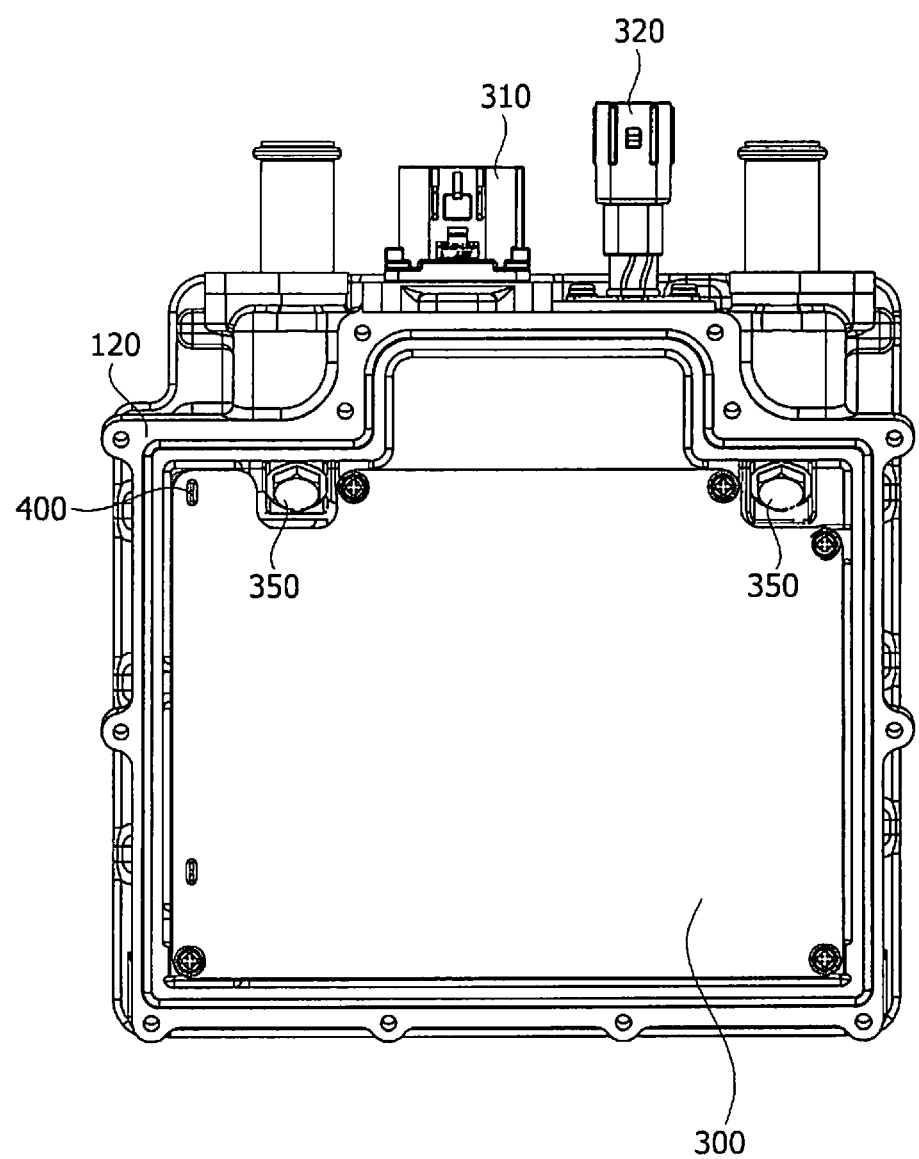
FIG. 4 is a front view illustrating a state in which a first cover is separated in FIG. 1.
Figure 5:
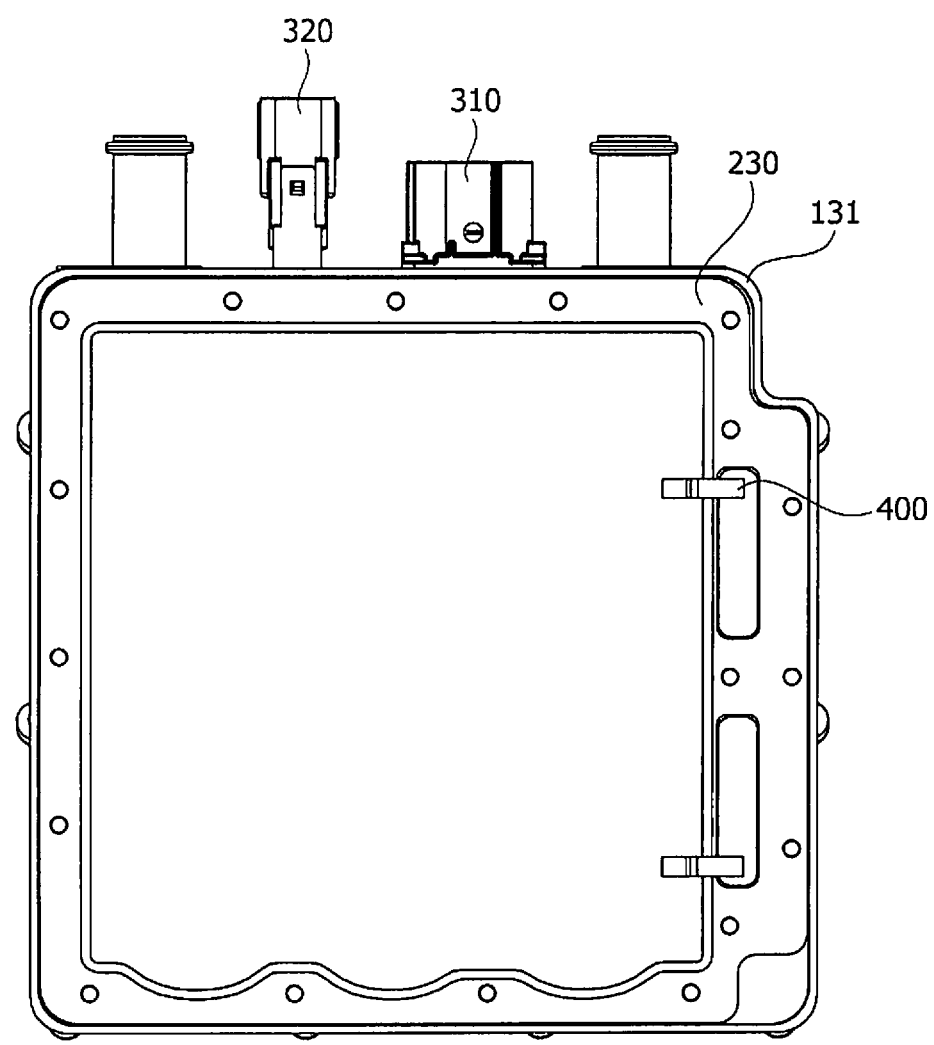
FIG. 5 is a rear view illustrating a state in which a second cover is separated in FIG. 1.

FIG. 1 is a perspective view of a fluid heating heater according to an embodiment of the present disclosure, FIGS. 2 and 3 are exploded perspective views of FIG. 1, FIG. 4 is a front view illustrating a state in which a first cover is separated in FIG. 1, and FIG. 5 is a rear view illustrating a state in which a second cover is separated in FIG. 1.

Referring to FIG. 1 to FIG. 5, a fluid heating heater 10 according to the embodiment of the present disclosure may include a main body 100, a first cover 210, a second cover 220, a heating plate 230, a circuit board 300, and a bus bar 400, and may further include a first connector 310, a second connector 320, electronic elements 330 and 340 and/or water temperature sensors 350.

The main body 100 may include a partition part 110, a first sidewall portion 120, a second sidewall portion 130, a flow path forming part 140, and a pair of protruding parts 150.

The partition part 110 may have a plate shape including one surface and the other surface which is a surface opposite the one surface.

The first sidewall portion 120 may be disposed on one surface of the partition part 110, and the second sidewall portion 130 may be disposed on the other surface of the partition part 110.

The flow path forming part 140 may be formed on the other surface of the partition part 110 to expose a flow path 141.

The flow path forming part 140 may have a shape configured to protrude from the other surface of the partition part 110, but is not limited thereto, and may have a shape in which the other surface of the partition part 110 is partially recessed.

The pair of protruding parts 150 may be disposed on one surface of the partition part 110. A fluid supply pipe 160 and a fluid discharge pipe 170 may be respectively coupled to the pair of protruding parts 150.

The fluid supply pipe 160 may supply a fluid to the flow path 141, and the fluid discharge pipe 170 may discharge the fluid from the flow path 141.

The first cover 210 may be coupled to the first sidewall portion 120 by a fastening member such as a bolt or the like to form a first accommodation space in front of the main body 100. The second cover 220 may be coupled to the second sidewall portion 130 by a fastening member such as a bolt or the like to form a second accommodation space behind the main body 100. A sealing member S such as an O-ring may be interposed between the first cover 210 and the main body 100, between the second cover 220 and the heating plate 230, and between the heating plate 230 and the main body 100 to improve water tightness.

The heating plate 230 may be disposed on the flow path forming part 140 to close an exposed surface of the flow path 141. For example, a straight portion and a curved portion configuring the flow path forming part 140 may come into contact with one surface of the heating plate 230.

The heating plate 230 may be disposed on the second sidewall portion 130 and the flow path forming part 140, and may be coupled to the second sidewall portion 130 with the second cover 220 by a fastening member such as a bolt or the like. The second sidewall portion 130 may include an edge portion 131 forming a step so that the heating plate 230 may be inserted thereinto. The edge portion 131 may protrude from an edge of the second sidewall portion 130 to support a side surface of the heating plate 230.

The circuit board 300 may be disposed at an inner side of the first sidewall portion 120. Further, the circuit board 300 may be coupled to a plurality of posts 111 configured to protrude from one surface of the partition part 110 by a fastening member such as a bolt or the like. Accordingly, the circuit board 300 may be disposed to be spaced apart from one surface of the partition part 110, and a space in which the electronic elements 330 and 340 are disposed may be secured between the circuit board 300 and one surface of the partition part 110.

The first connector 310 and the second connector 320 may pass through the first sidewall portion 120 to electrically connect an external power source (not shown) and the circuit board 300. The first connector 310 may be a high voltage connector (HV connector), and the second connector 320 may be a low voltage connector (LV connector). The circuit board 300 may receive electricity from the external power source through the first connector 310 and the second connector 320.

The electronic elements 330 and 340 may be disposed in a seating groove 112 or on a platform 113 formed at one surface of the partition part 110. Accordingly, the electronic elements 330 and 340 may heat exchange with the fluid which flows along the flow path 141 with the partition part 110 therebetween. Accordingly, overheating of the electronic elements 330 and 340 may be prevented, and the fluid may be heated to improve energy efficiency using heat generated from electronic elements 330 and 340.

The electronic elements 330 and 340 may be electrically connected to the circuit board 300 to implement various control logic with a circuit pattern (not shown), an element (not shown), and the like printed on or embedded in the circuit board 300. The electronic elements 330 and 340 may include a capacitor 330, an IGBT 340, or the like but are not limited thereto.

The bus bar 400 may be disposed in a connection hole 110e passing through the partition part 110 to electrically connect the heating pattern of the heating plate 230 and the circuit board 300. The heating pattern of the heating plate 230 may receive electricity through the bus bar 400. The heating pattern may be an electrical resistor which generates heat when receiving electricity. Meanwhile, the connection hole 110e may pass through the partition part 110 from the inside of the first sidewall portion 120 and the second sidewall portion 130.

Figure 6:
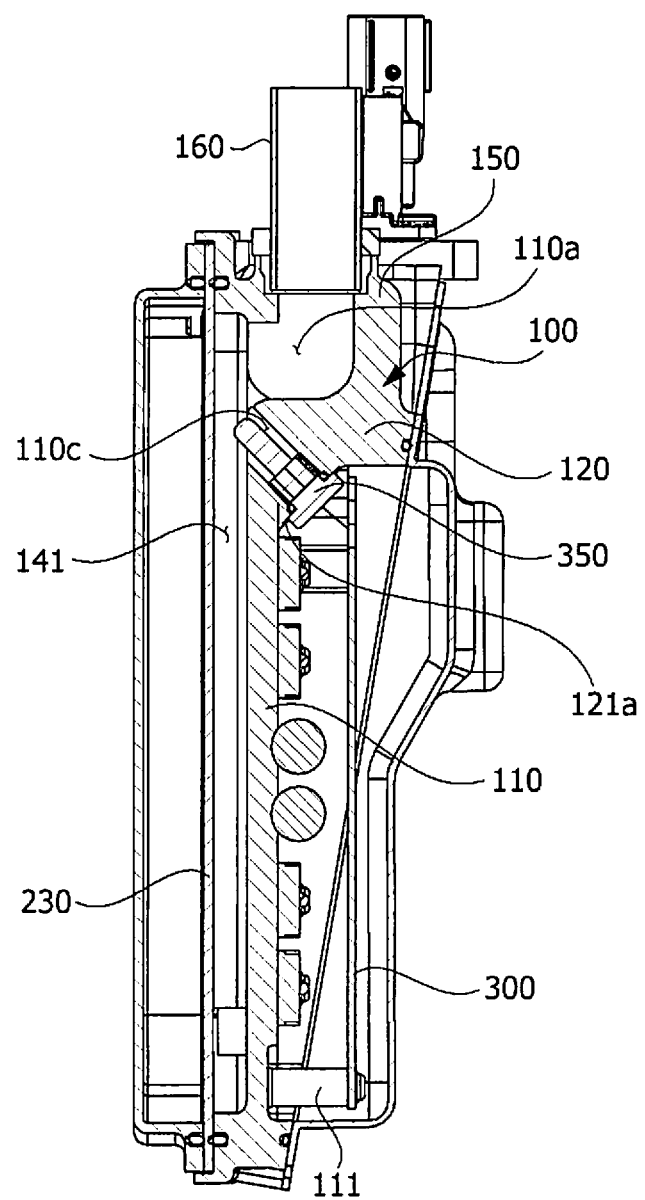
FIG. 6 is a cross-sectional view taken along line A-A in FIG. 1.
Figure 7:
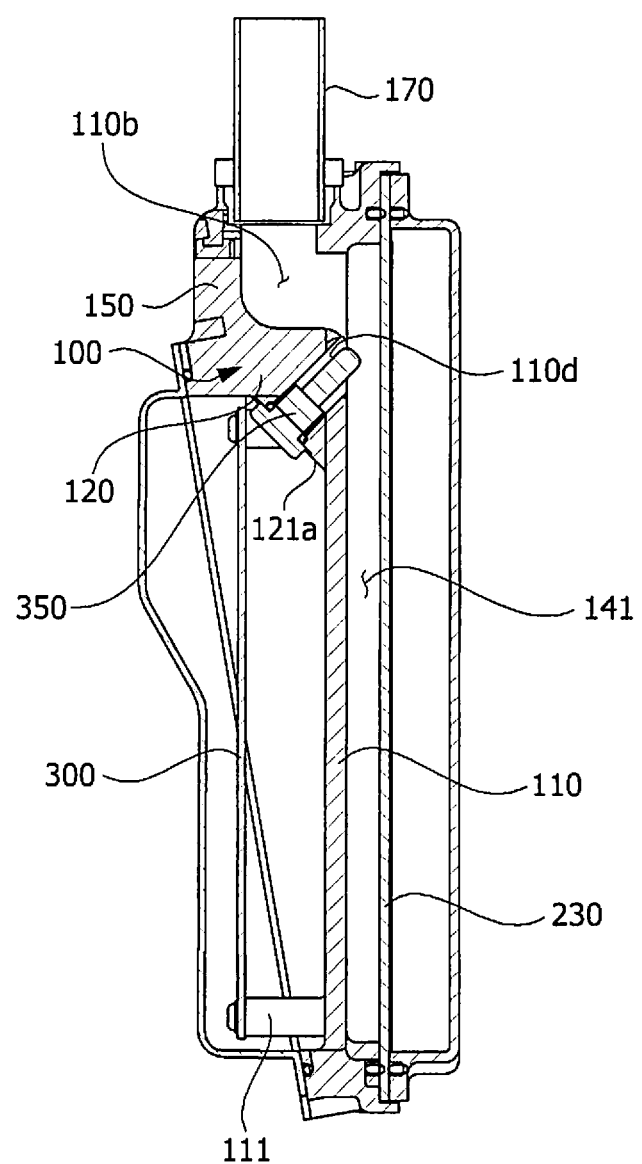
FIG. 7 is a cross-sectional view taken along line B-B in FIG. 1.

FIG. 6 is a cross-sectional view taken along line A-A in FIG. 1, and FIG. 7 is a cross-sectional view taken along line B-B in FIG. 1.

Referring to FIGS. 6 and 7, the main body 100 may include an inlet 110a and an outlet 110b configured to pass through the partition part 110 from the outside of the first sidewall portion 120.

The inlet 110a and the outlet 110b may be connected to the flow path 141, and may extend into the pair of protruding parts 150 to be connected to the fluid supply pipe 160 and the fluid discharge pipe 170, respectively.

A pair of water temperature sensors 350 may be disposed in a pair of insertion holes 110c and 110d configured to pass through the partition part 110, respectively. The insertion holes 110c and 110d may be connected to the flow path 141 by passing through the partition part 110 from the inside of the first sidewall portion 120. Further, the pair of insertion holes 110c and 110d may be disposed at positions corresponding to the inlet 110a and outlet 110b, respectively. That is, the pair of insertion holes 110c and 110d may be disposed to face the inlet 110a and outlet 110b with the first sidewall portion 120 therebetween. Accordingly, the pair of water temperature sensors 350 may measure a temperature of the fluid directly after being introduced into the flow path 141 and a temperature of the fluid directly before being discharged from the flow path 141. Meanwhile, the circuit board 300 may receive temperature data from the pair of water temperature sensors 350 and adjust power or the like supplied to the heating plate 230 on the basis of the temperature data so that the temperature of the fluid discharged from the flow path 141 may reach a predetermined target temperature.

The pair of insertion holes 110c and 110d may be disposed in a pair of inclined surfaces 121a. The inclined surfaces 121a may be disposed to be inclined with respect to one surface of the partition part 110 and connected to an inner side surface of the first sidewall portion 120. The insertion holes 110c and 110d may extend from one surface of the partition part 110 in an inclined direction. Accordingly, when the water temperature sensors 350 are installed and replaced, a problem in which a jig (not shown) configured to catch and transfer the water temperature sensors 350 may collide with the first sidewall portion 120 may be improved. The insertion holes 110c and 110d may extend in directions vertical to the inclined surfaces 121a but are not limited thereto.

Figure 8:
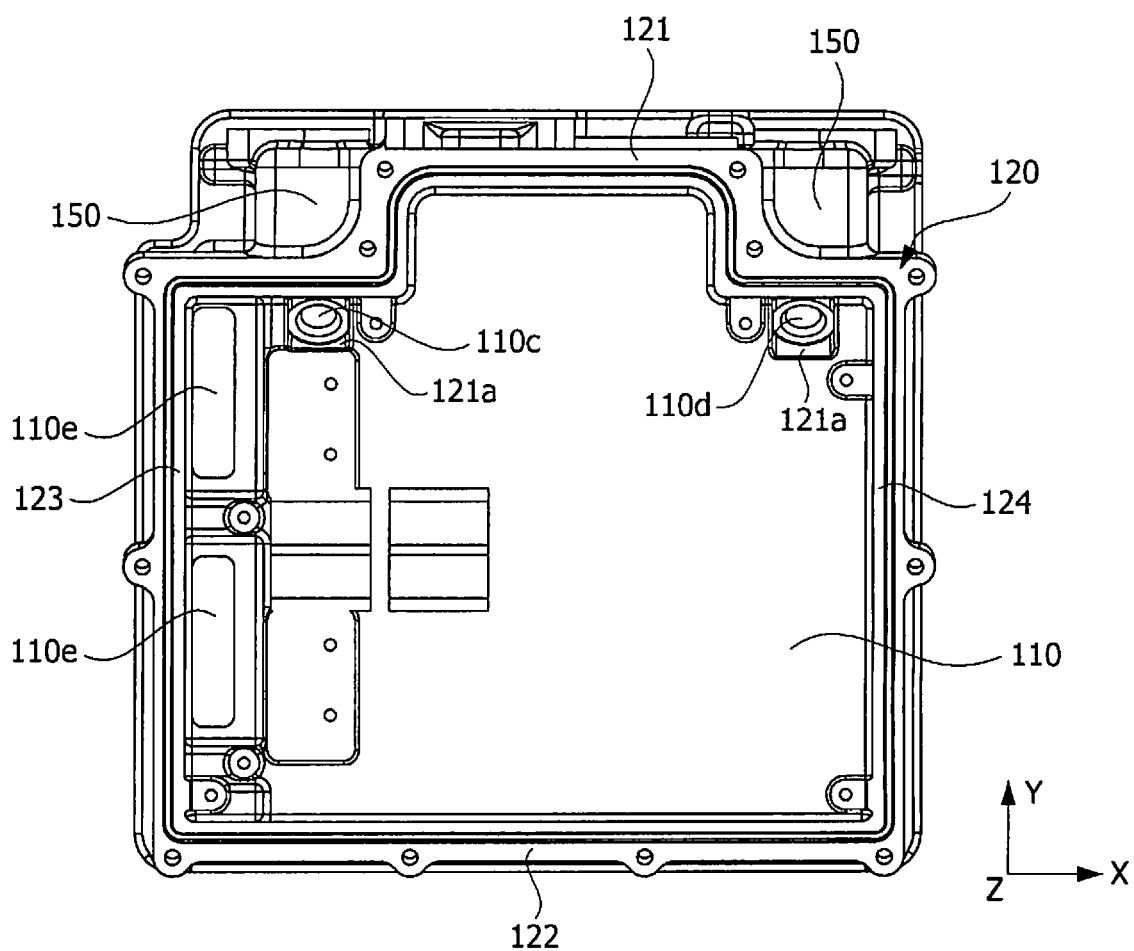
FIG. 8 is a front view of a main body in FIG. 2.
Figure 9:
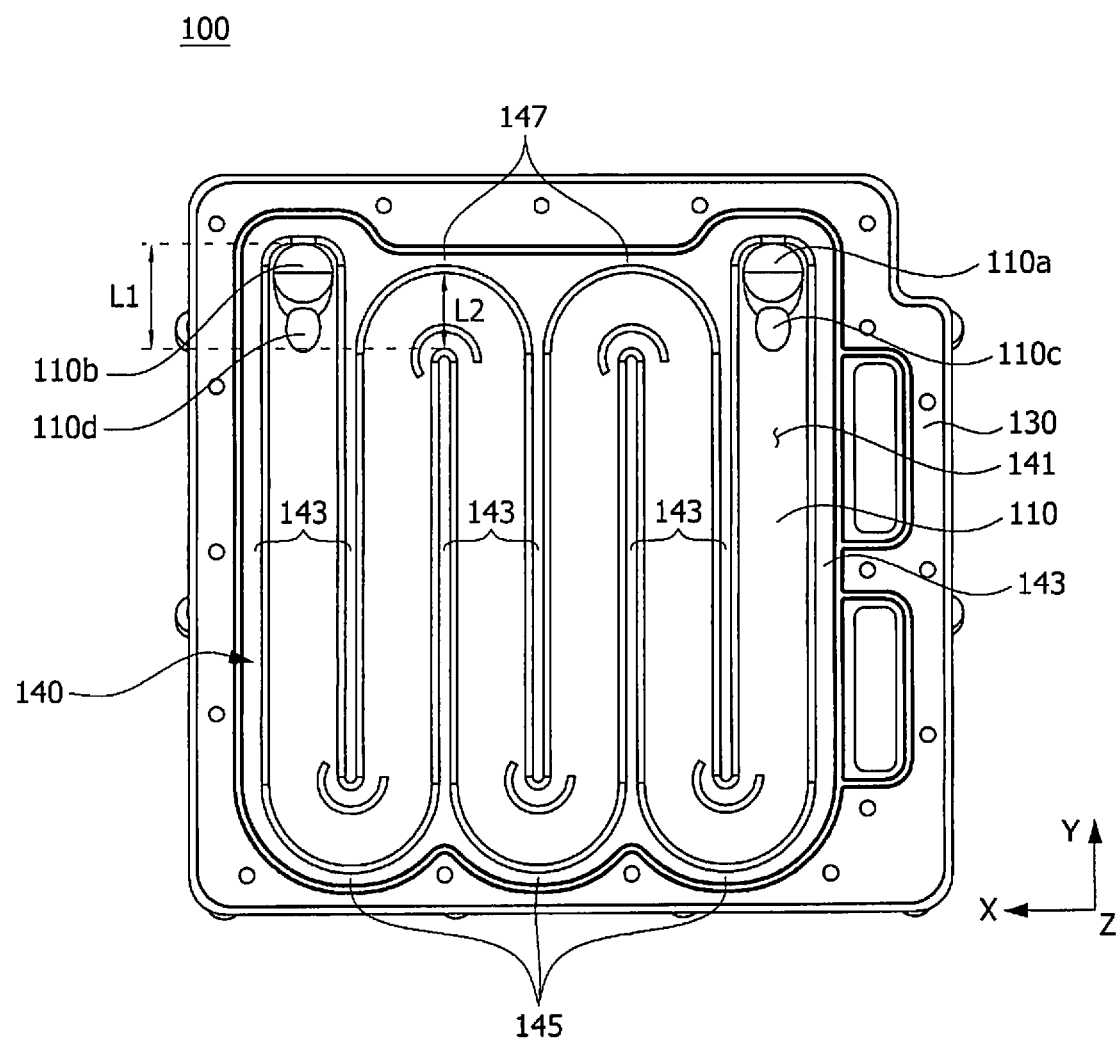
FIG. 9 is a rear view of the main body in FIG. 2.
Figure 10:
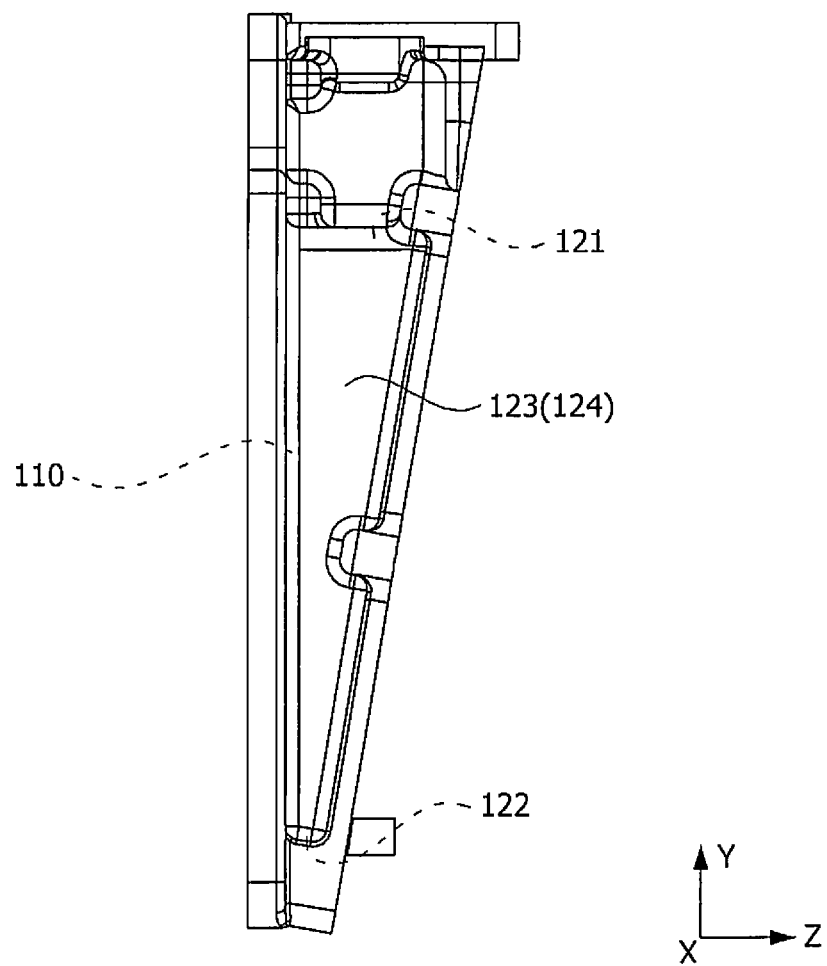
FIG. 10 is a side view of the main body in FIG. 2.
Figure 11:
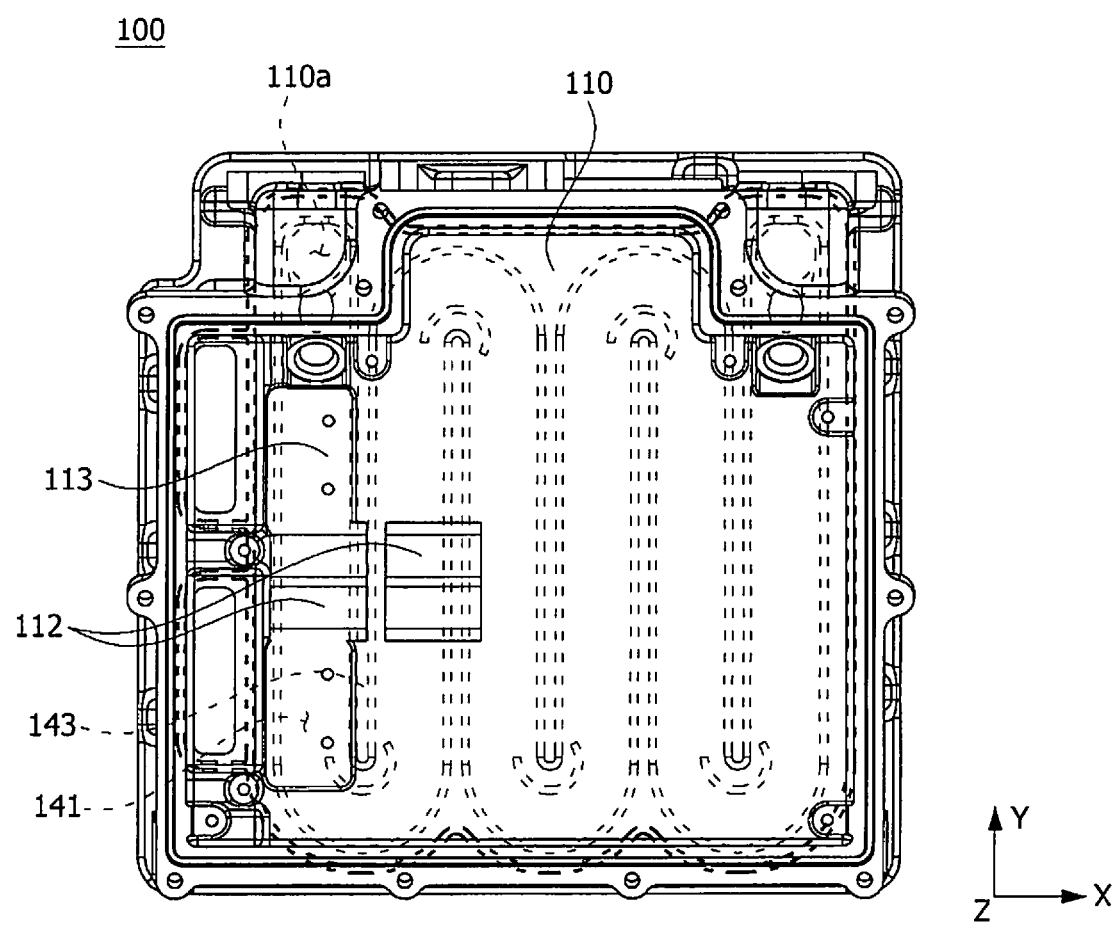
FIG. 11 is a front view in which FIG. 8 and FIG. 9 overlap.

FIG. 8 is a front view of the main body in FIG. 2, FIG. 9 is a rear view of the main body in FIG. 2, FIG. 10 is a side view of the main body in FIG. 2, and FIG. 11 is a front view in which FIG. 8 and FIG. 9 overlap.

Referring to FIG. 8, the first sidewall portion 120 may include a first-first sidewall 121 and a first-second sidewall 122 facing each other, and a first-third sidewall 123 and a first-fourth sidewall 124 configured to connect the first-first sidewall 121 and the first-second sidewall 122 and face each other.

An inner side surface of the first-first sidewall 121 may be connected to the pair of inclined surfaces 121a, and an outer side surface of the first-first sidewall 121 may be connected to the pair of protruding parts 150. The pair of inclined surfaces 121a may be disposed to face the pair of protruding parts 150.

Referring to FIGS. 4 and 8, the first connector 310 and the second connector 320 may be disposed to pass through the first-first sidewall 121. Further, the first connector 310 and the second connector 320 may be disposed between the pair of protruding parts 150 or between the pair of inclined surfaces 121a.

Referring to FIG. 9, the flow path 141 may extend to the outlet 110b from the inlet 110a, and the pair of insertion holes 110c and 110d may be disposed adjacent to the inlet 110a and outlet 110b, respectively.

The flow path forming part 140 may be disposed at the inner side of the second sidewall portion 130. The flow path forming part 140 may include a plurality of straight portions 143 which are disposed in parallel to each other, and a plurality of curved portions 145 and 147 configured to connect the plurality of straight portions 143.

The straight portions 143 and the curved portions 145 and 147 may protrude from the other surface of the partition part 110.

The curved portions 145 and 147 may include a first curved portion 145 and a second curved portion 147 disposed at opposite sides with respect to the straight portions 143. For example, the first curved portion 145 may be disposed at a second end of the straight portions 143, and the second curved portion 147 may be disposed at a first end of the straight portion 143. The inlet 110a and the outlet 110b may be disposed at the first end of the straight portion 143.

The plurality of first curved portions 145 may sequentially connect second ends of the odd-numbered straight portions 143 among the plurality of straight portions 143, and the plurality of second curved portions 147 may sequentially connect first ends of the even-numbered straight portions 143 among the plurality of straight portions 143.

On the basis of a direction parallel to the straight portions 143, maximum distances L1 from the first ends of the straight portions 143 to the inlet 110a and the outlet 110b may be greater than maximum distances L2 from the first ends of the straight portions 143 to the second curved portions 147. Accordingly, bubbles introduced into the flow path 141 or generated in the flow path 141 may be discharged to the outside of the flow path 141 through the outlet 110b. When the bubbles are accumulated in the flow path 141, a localized heat concentration phenomenon may occur in the heating plate, and accordingly, a deterioration in heat generation performance of the heating plate may be caused, and further, fire may be caused.

Referring to FIGS. 8 and 10, with respect to one surface of the partition part 110, a height of each of the first-third sidewall 123 and the first-fourth sidewall 124 may decrease as distances thereof from the first-first sidewall 121 increase. With respect to one surface of the partition part 110, a height of the first-second sidewall 122 may be smaller than a height of the first-first sidewall 121. Accordingly, when the water temperature sensor is installed and replaced, a problem in which the jig configured to catch and transfer the water temperature sensor may collide with the first-second sidewall 122 may be improved. In this case, since the first cover includes a third sidewall portion having a shape corresponding to the second sidewall portion, a distance between the partition part 110 and the first cover may be kept constant throughout an entire area of the partition part 110. For example, a plate portion of the first cover facing one surface of the partition part 110 may be disposed to be parallel to one surface of the partition part 110.

Referring to FIG. 11, the seating groove 112 or the platform 113 may overlap the flow path 141 in a direction passing through one surface and the other surface of the partition part 110. Further, the inlet 110a and the seating groove 112 or the platform 113 may overlap in an extending direction of the flow path 141, that is, in a direction parallel to the straight portions 143.

Figure 12:
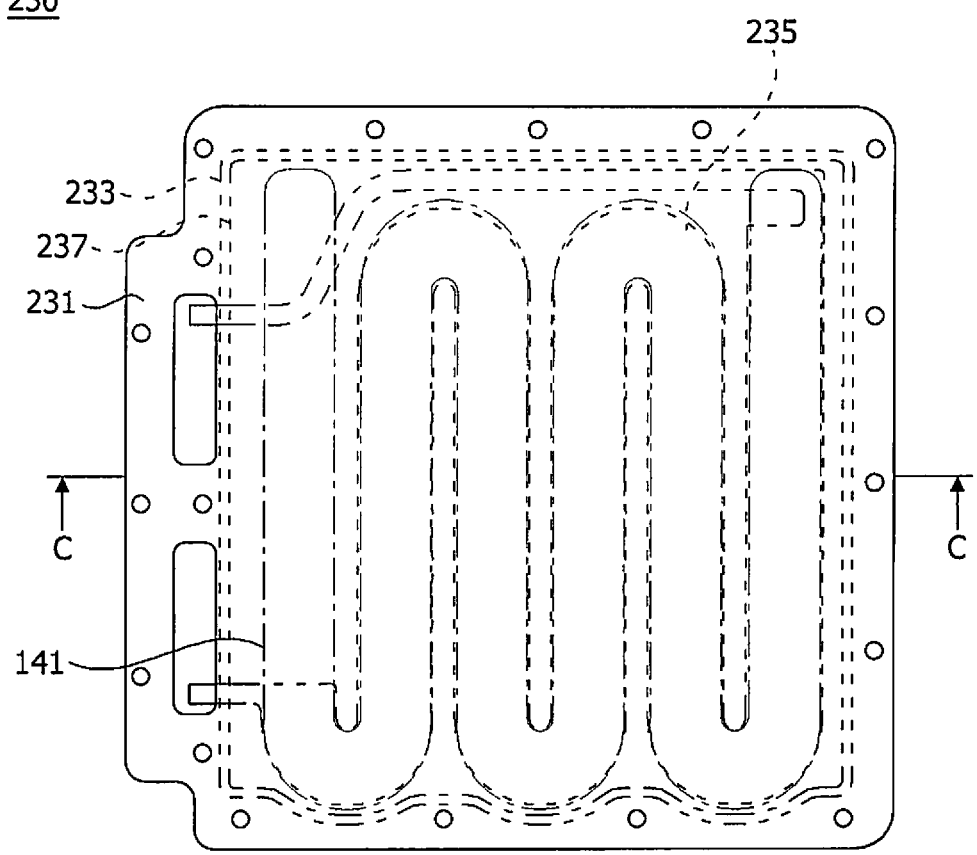
FIG. 12 is a front view of a heating plate in FIG. 2.
Figure 13:
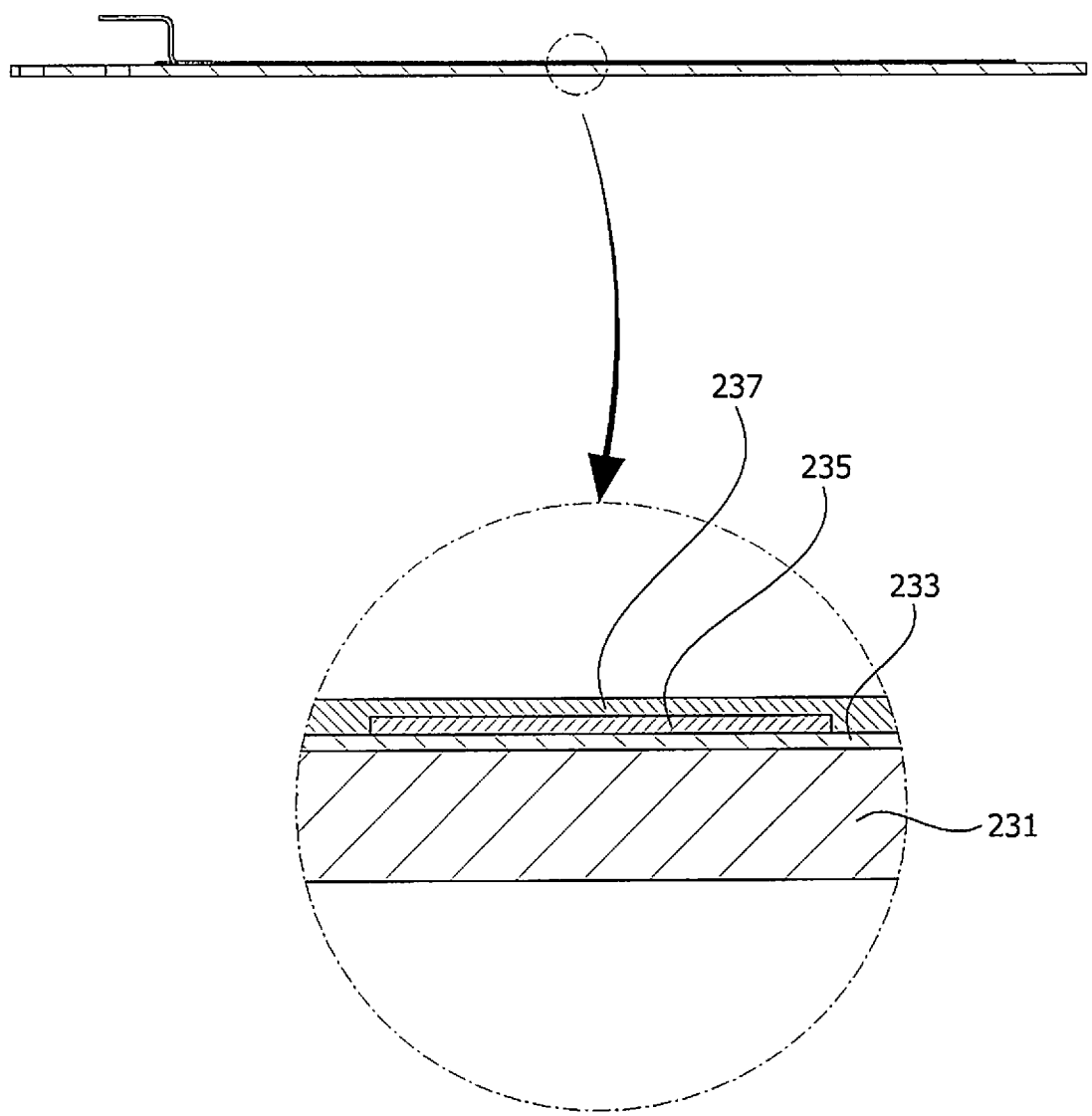
FIG. 13 is a cross-sectional view taken along line C-C in FIG. 12.

FIG. 12 is a front view of the heating plate in FIG. 2, and FIG. 13 is a cross-sectional view taken along line C-C in FIG. 12.

Referring to FIGS. 12 and 13, the heating plate 230 may include a metal plate 231 including one surface which comes into contact with the flow path 141 ant the other surface which is a surface opposite one surface, a first insulation layer 233 disposed on the other surface of the metal plate 231, a heating pattern 235 disposed on the first insulation layer 233, and a second insulation layer 237 configured to surround the heating pattern 235.

The metal plate 231 may include aluminum (Al), stainless steel (SUS), or the like, but is not limited thereto, and may also include other materials having excellent heat conductivity.

The first insulation layer 233 may provide an electrical insulation property between the metal plate 231 and the heating pattern 235.

The heating plate 230 may include the heating pattern 235 corresponding to the flow path 141. That is, the heating pattern 235 may extend along the flow path 141. Although a case in which one heating pattern 235 is disposed in the flow path 141 is described, the present disclosure is not limited thereto, and two or more heating patterns 235 which are parallel to each other may be disposed in the flow path 141. In FIG. 12, for convenience of description, the flow path 141 formed in the main body is indicated by a one dot chain line, and the first insulation layer 233, the heating pattern 235, and the second insulation layer 237 are formed on the other surface of the metal plate 231 to be shown as a dotted line which is not visible from one surface of the metal plate 231.

Figure 14:
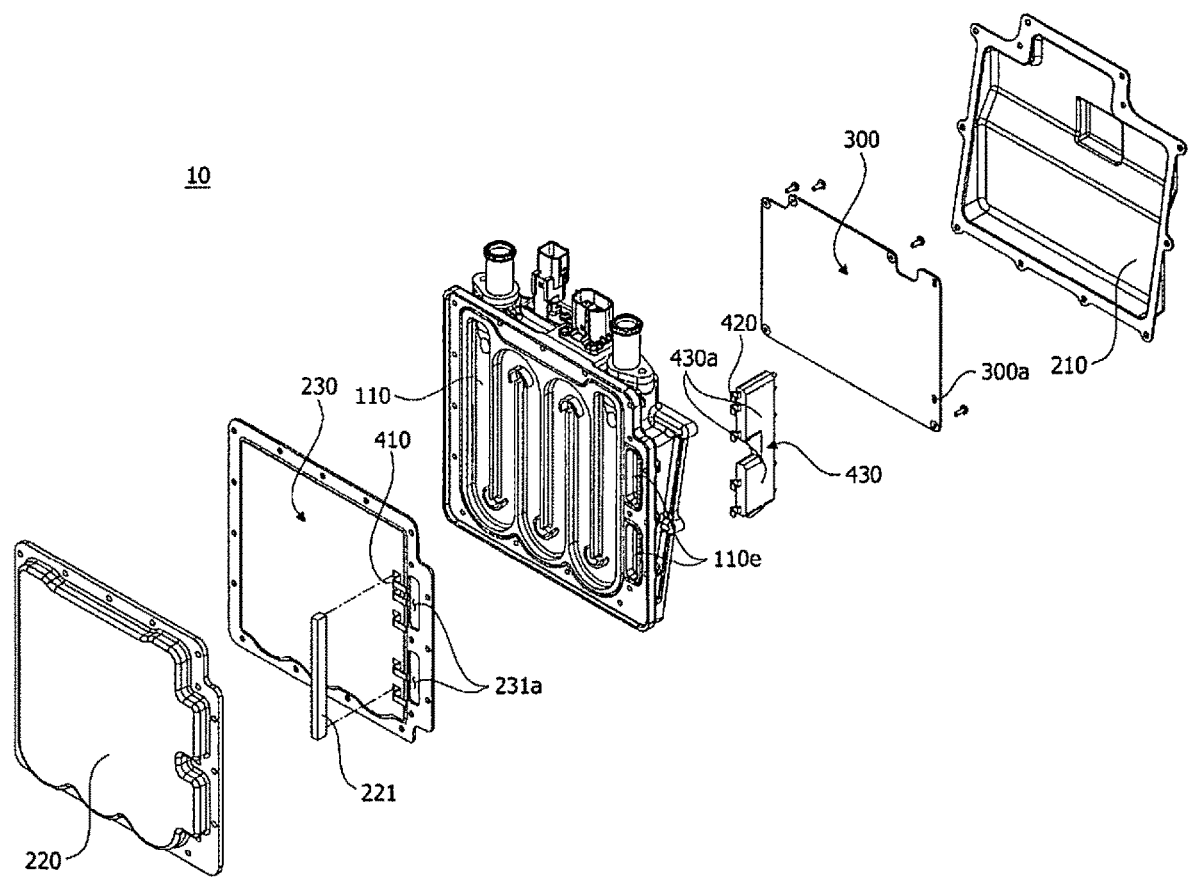
FIG. 14 is an exploded perspective view of FIG. 1.
Figure 15:
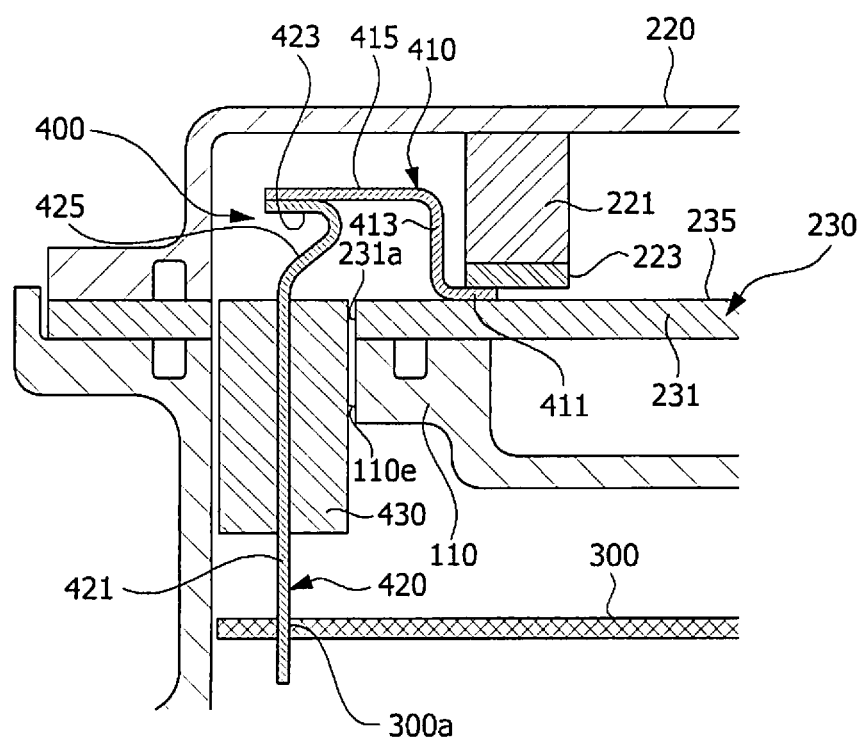
FIG. 15 is a cross-sectional view in a direction vertical to line A-A in FIG. 1.

FIG. 14 is an exploded perspective view of FIG. 1, and FIG. 15 is a cross-sectional view in a direction vertical to line A-A in FIG. 1.

Referring to FIGS. 14 and 15, the bus bar 400 may include a first terminal 410 disposed on the heating pattern 235, a second terminal 420 configured to connect the first terminal 410 and the circuit board 300, and a bus bar frame 430 to which the plurality of second terminals 420 are coupled.

The first terminal 410 may include a first-first horizontal portion 411 disposed on the heating pattern 235, a first vertical portion 413 bent from the first-first horizontal portion 411 in a direction vertical to the other surface of the metal plate 231, and a first-second horizontal portion 415 bent from the first vertical portion in a direction opposite the first-first horizontal portion 411.

The first-first horizontal portion 411 may be bonded to heating pattern 235 through soldering, welding, or the like, but is not limited thereto.

The first-second horizontal portion 415 may be disposed to be spaced apart from the other surface of the metal plate 231. Meanwhile, the metal plate 231 may include a second connection hole 231a configured to pass through one surface and the other surface of the metal plate 231, and the second connection hole 231a may overlap the connection hole 110e of the partition part 110. The first-second horizontal portion 415 may be disposed on the second connection hole 231a. Accordingly, the first-second horizontal portion 415 may be disposed on the second terminal 420.

As shown in FIG. 12, at least one first terminal 410 may be disposed on each of the plurality of heating patterns 235. For example, the first terminal 410 may include a plurality of first terminals 410 respectively connected to one ends of the plurality of heating patterns 235, and one first terminal 410 simultaneously connected to the other ends of the plurality of heating patterns 235. That is, the number of first terminals 410 may be greater than the number of heating patterns 235, but is not limited thereto.

The second terminal 420 may include a second vertical portion 421 inserted into a slot 300a of the circuit board 300, a second horizontal portion 423 facing the first-second horizontal portion 415, and a connection part 425 bent from the second vertical portion 421 and the second horizontal portion 423.

The second vertical portion 421 may be coupled to the bus bar frame 430 to vertically pass through the bus bar frame 430.

The connection part 425 may connect the second vertical portion 421 and the second horizontal portion 423.

The connection part 425 may be disposed to be inclined with respect to the second vertical portion 421 and the second horizontal portion 423. Accordingly, the connection part 425 may allow vertical movement of the second horizontal portion 423 within a predetermined range through bending deformation or the like at a connection portion between the second vertical portion 421 and the second horizontal portion 423. Accordingly, the second horizontal portion 423 may come into close contact with the first-second horizontal portion 415.

One second terminal 420 may be disposed on each of the plurality of first terminals 410. That is, the number of first terminals 410 and the number of second terminals 420 may be the same.

The bus bar frame 430 may include a plurality of protruding parts 430a respectively inserted into a plurality of connection holes 110e configured to pass through the partition part 110. Accordingly, a portion of the bus bar frame 430 configured to connect the plurality of protruding parts 430a is blocked by the partition part 110, so that upward movement of the bus bar frame 430 may be restricted. Accordingly, a problem in which the second terminal 420 may be arbitrarily separated from the slot 300a of the circuit board 300 may be improved.

The second cover 220 may include a fixing member 221 disposed on the first-first horizontal portion 411 of the first terminal 410.

The fixing member 221 may come into close contact with the first-first horizontal portion 411 to press the first terminal 410 toward the heating plate 230. Accordingly, a problem in which solder or the like which connects the heating plate 230 and the first terminal 410 disappears due to heat generation from the heating plate 230 or the like, and thus a gap may be generated between the heating plate 230 and the first terminal 410 may be improved.

The number of fixing members 221 may be smaller than the number of plurality of first terminals 410, and preferably, may be only one, but an elastic layer 223 may be disposed on an end portion of the fixing member 221 to compensate for a difference of heights of the plurality of first terminals 410. The elastic layer 223 may include silicon or the like, but is not limited thereto.

Figure 16:
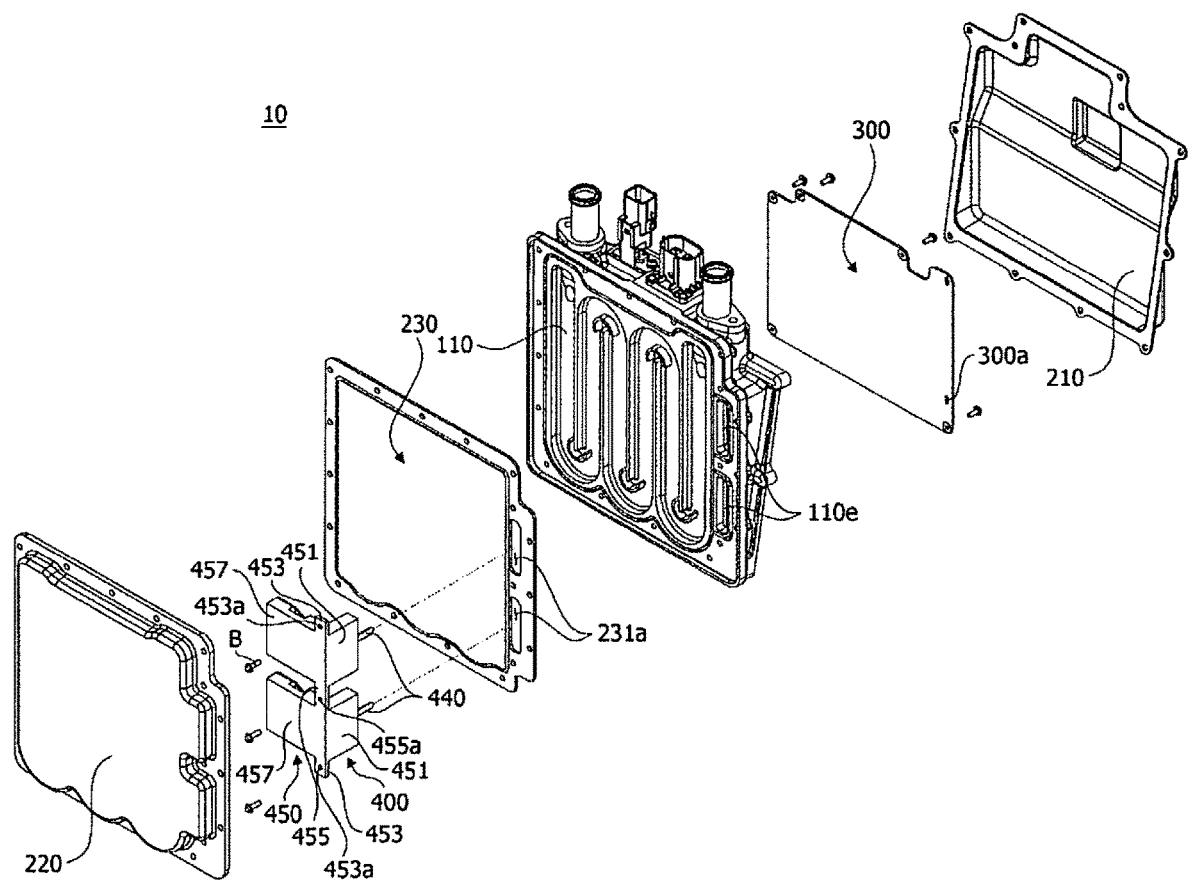
FIG. 16 is a modified example of FIG. 14.
Figure 17:
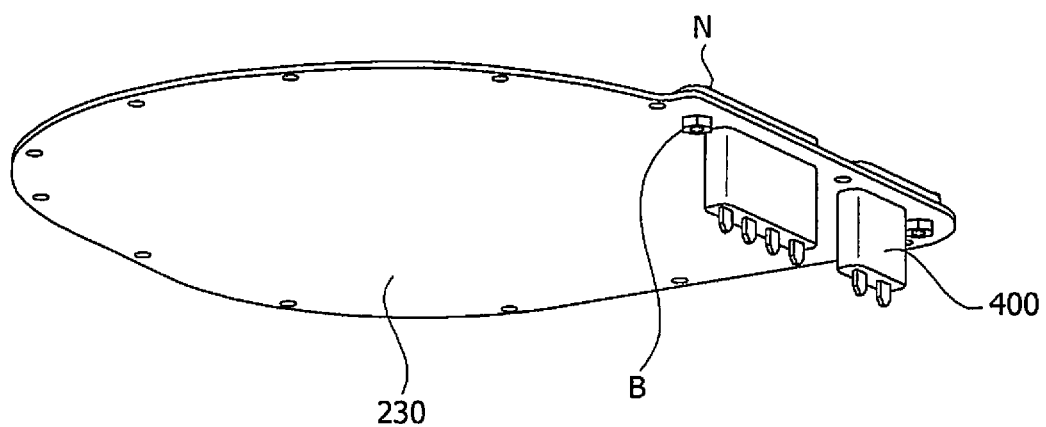
FIG. 17 is a perspective view schematically illustrating a bus bar coupling relation in FIG. 16.
Figure 18:
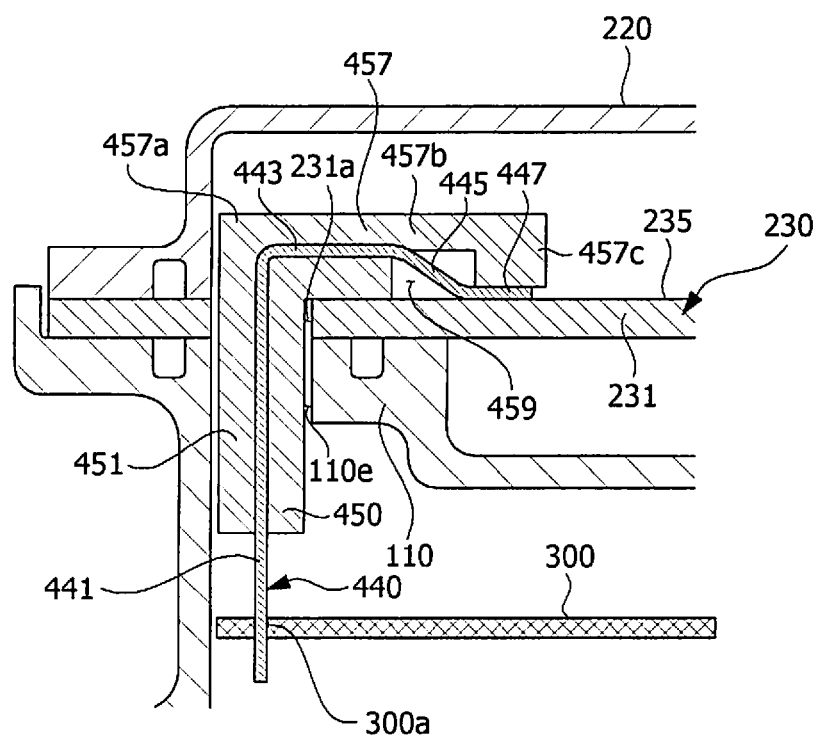
FIG. 18 is a modified example of FIG. 15.

FIG. 16 is a modified example of FIG. 14, FIG. 17 is a perspective view schematically illustrating a bus bar coupling relation in FIG. 16, and FIG. 18 is a modified example of FIG. 15.

Referring to FIGS. 16 to 18, the bus bar 400 may include a terminal 440 disposed on the heating pattern 235 and connected to the circuit board 300, and a bus bar frame 450 fixed to the heating plate 230 to prevent the terminal 440 from separating from the heating pattern 235.

The terminal 440 may be manufactured by bending one conductor, and may include a vertical portion 441, a first horizontal portion 443, a connection part 445, and a second horizontal portion 447.

The vertical portion 441 may extend in a direction vertical to the heating plate 230 or the circuit board 300.

One end of the vertical portion 441 may be inserted into the slot 300a of the circuit board 300.

The first horizontal portion 443 may horizontally extend from the other end of the vertical portion 441. For example, the first horizontal portion 443 may extend to be parallel to the heating plate 230.

The connection part 445 may connect the first horizontal portion 443 and the second horizontal portion 447.

The connection part 445 may be bent from the first horizontal portion 443 and the second horizontal portion 447, and disposed to be inclined with respect to the first horizontal portion 443 and the second horizontal portion 447. Accordingly, the connection part 445 may allow vertical movement of the second horizontal portion 447 within a predetermined range through bending deformation or the like at a connection portion between the first horizontal portion 443 and the second horizontal portion 447. Accordingly, the second horizontal portion 447 may come into close contact with the heating pattern 235 by an external force.

The second horizontal portion 447 may extend to be parallel to the heating plate 230, and may be disposed on an end portion of the heating pattern 235.

The bus bar frame 450 may include a frame main body 451 configured to surround the vertical portion 441 of the terminal 440, and a cantilever 457 configured to horizontally extend from the frame main body 451 to be disposed on the second horizontal portion 447. Accordingly, the second horizontal portion 447 may be disposed between the heating pattern 235 and the cantilever 457.

The frame main body 451 may be disposed in the connection hole 110e of the partition part 110 and the second connection hole 231a of the heating plate 230. The second connection hole 231a may be formed by passing through one surface and the other surface of the metal plate 231, and may be disposed to overlap the connection hole 110e of the partition part 110.

The frame main body 451 may include a seating part 453. The seating part 453 may be disposed on the other surface of the metal plate 231 which is a surface on which the heating pattern 235 is formed. A fastening hole 453a into which a fastening member B such as a bolt or the like fastened to the partition part 110 and the heating plate 230 is inserted may be formed in the seating part 453. Accordingly, the frame main body 451 may be fixed to the heating plate 230, and improve a lifting phenomenon of the heating plate 230. The fastening member B may be fixed by a nut N.

A pair of terminals 440 configured to connect both ends of the heating pattern 235 to the circuit board 300 may be coupled to the frame main body 451. However, the pair of terminals 440 are not limited to the above, and as shown in FIG. 16, the pair of terminals 440 may be coupled to the pair of frame main body 451, respectively. Accordingly, a separation distance between the pair of terminals 440 may be sufficiently secured to maintain an insulation property.

A pair of frame main bodies 451 may be connected to each other through a second connection part 455.

The second connection part 455 may be disposed on the other surface of the metal plate 231 which is a surface on which the heating pattern 235 is formed.

A fastening hole 455a into which the fastening member B such as a bolt or the like fastened to the partition part 110 and the heating plate 230 is inserted may be formed in the second connection part 455. Accordingly, a lifting phenomenon of the heating plate 230 and the second connection part 455 may be improved. The fastening member B may be fixed by the nut N.

The cantilever 457 may be disposed on the other surface of the metal plate 231, which is a surface on which the heating pattern 235 is formed, to press the second horizontal portion 447 toward the heating plate 230 and the heating pattern 235. Accordingly, the second horizontal portion 447 may be brought into close contact with the heating pattern 235 without being fixed to the heating plate 230 by welding or the like, and a problem in which a gap is formed between the heating pattern 235 and the second horizontal portion 447 may be improved.

The cantilever 457 may include a first area 457a, a second area 457b, and a third area 457c. The third area 457c may be disposed on the second horizontal portion 447.

The first area 457a may surround the first horizontal portion 443. That is, the cantilever 457 may be disposed on the heating plate 230 at the first area 457a. Accordingly, the cantilever 457 may secure a separation distance between the first horizontal portion 443 and the metal plate 231 at the first area 457a to a sufficient size to maintain insulation.

A groove 459 configured to expose the connection part 445 may be formed in the second area 457b. That is, the cantilever 457 may have a smaller thickness at the second area 457b in comparison with the first area 457a and the third area 457c. Accordingly, elastic bending deformation of the cantilever 457 may become easy, and accordingly, the cantilever 457 may press the second horizontal portion 447 toward the heating pattern 235 at the third area 457c.

According to an embodiment, since a heating pattern is formed along a flow path, an overlapping area between a fluid and a heat generation body can be maximized, and since the flow path is formed in the other surface of a partition part and the heat generation body is formed in a plate shape, a product size can be minimized.

Further, since solder or the like which connects a heating plate and an electrical terminal disappears due to heat generation from the heating plate or the like, a gap can be generated between the heating plate and the electrical terminal, but the above problem can be improved by a fixing member.

In addition, when the terminal is fixed to the heating plate through welding or the like, a problem in which the solder disappears due to the heat generation from the heating plate during operation of a heater and thus the generated gap between the heating plate and the terminal can be improved. That is, since separation of the terminal is prevented by a bus bar frame fixed to the heating plate, the problem in which a gap is generated between heating plate and the terminal can be prevented without adding soldering or a separate fixing member.

In addition, since the terminal can be manufactured as one integrated component, the number of components can be decreased and cost competitiveness can be improved. However, the present disclosure is not limited thereto, and manufacturing the terminal as a plurality of components can also be in the scope of the present disclosure.

Various and advantageous advantages and effects of the present disclosure are not limited to the above, and can be more easily understood in a process of describing specific embodiments of the present disclosure.

Although preferable embodiments of the present disclosure is described above, those skilled in the art may variously modify and change the present disclosure through supplementation, change, removal, or addition of the elements within the spirit of the present disclosure which will be described in the claims, and the above are also within the scope of the present disclosure.

What is claimed is:

1. A fluid heating heater comprising:
   a main body including a plate-shaped partition part, and a flow path forming part forming a flow path in a surface of the partition part;
   a heating plate disposed on the flow path forming part in a plate shape, and including a heating pattern having a shape corresponding to the flow path;
   a circuit board disposed on one surface of the partition part to control heat generation of the heating pattern; and
   a bus bar configured to electrically connect the heating pattern and the circuit board,
   a first cover disposed on the one surface of the partition part; and
   a second cover disposed on the other surface of the partition part,
   wherein the main body includes a first sidewall portion disposed on the one surface of the partition part, and a second sidewall portion disposed on the other surface of the partition part,
   wherein the first cover is coupled to the first sidewall portion, and
   wherein the second cover is coupled to the second sidewall portion,
   wherein the main body includes an inlet and an outlet configured to pass through the partition part from the outside of the first sidewall portion; and the flow path extends from the inlet to the outlet,
   a pair of water temperature sensors configured to pass through the partition part from the inside of the first sidewall portion to be respectively disposed in a pair of insertion holes connected to the flow path,
   wherein the first sidewall portion includes a first-first sidewall and a first-second sidewall facing each other, and a first-third sidewall and a first-fourth sidewall configured to connect the first-first sidewall and the first-second sidewall and face each other;
   an inner side surface of the first-first sidewall includes a pair of inclined surfaces which are inclined with respect to the one surface of the partition part; and
   the pair of insertion holes are respectively disposed in the pair of inclined surfaces to be respectively disposed at positions corresponding to the inlet and the outlet.

2. The fluid heating heater of claim 1, wherein the insertion holes extend in a direction vertical to the inclined surface.

3. The fluid heating heater of claim 1, wherein:
   a height of each of the first-third sidewall and the first-fourth sidewall decreases as distances thereof from the first-first sidewall increase; and
   a height of the first-second sidewall is smaller than a height of the first-first sidewall.

4. The fluid heating heater of claim 1, comprising electronic elements disposed in a seating groove or on a platform formed at the one surface of the partition part,
   wherein the seating groove or the platform overlaps the flow path in a direction passing through the partition part, and overlaps the inlet in an extending direction of the flow path.

5. A fluid heating heater comprising:
   a main body including a plate-shaped partition part, and a flow path forming part forming a flow path in the other surface of the partition part;
   a heating plate disposed on the flow path forming part in a plate shape, and including a heating pattern having a shape corresponding to the flow path;
   a circuit board disposed on one surface of the partition part to control heat generation of the heating pattern; and
   a bus bar configured to electrically connect the heating pattern and the circuit board;
   a first cover disposed on the one surface of the partition part; and
   a second cover disposed on the other surface of the partition part,
   wherein the main body includes a first sidewall portion disposed on the one surface of the partition part, and a second sidewall portion disposed on the other surface of the partition part;
   wherein the first cover is coupled to the first sidewall portion;
   wherein the second cover is coupled to the second sidewall portion;

wherein the main body includes an inlet and an outlet configured to pass through the partition part from the outside of the first sidewall portion;

wherein the flow path extends from the inlet to the outlet, wherein the flow path forming part includes a plurality of straight portions which are disposed in parallel to each other, and a plurality of curved portions configured to connect the plurality of straight portions;

wherein the inlet and the outlet are disposed at a first end of the straight portion, wherein the plurality of curved portions include a plurality of first curved portions configured to sequentially connect second ends of the odd-numbered straight portions which are adjacent thereto among the plurality of straight portions, and a plurality of second curved portions configured to sequentially connect first ends of the even-numbered straight portions which are adjacent thereto among the plurality of straight portions; and wherein a maximum distance from the first end of the straight portion to the inlet and the outlet is greater than a maximum distance from the first end of the straight portion to the second curved portion, with respect to a direction parallel to the straight portion.

6. A fluid heating heater comprising:

a main body including a plate-shaped partition part, and a flow path forming part forming a flow path in the other surface of the partition part;

a heating plate disposed on the flow path forming part in a plate shape, and including a heating pattern having a shape corresponding to the flow path;

a circuit board disposed on one surface of the partition part to control heat generation of the heating pattern;

a bus bar configured to electrically connect the heating pattern and the circuit board; and a fixing member configured to prevent the bus bar from separating from the heating pattern;

wherein the bus bar includes a first terminal disposed at one end portion of the heating pattern and prevented from being separated by the fixing member, and a second terminal configured to connect the first terminal and the circuit board;

comprising a second cover disposed on the other surface of the partition part, the heating plate includes a metal plate including one surface which comes into contact with the flow path, a first insulation layer disposed on the other surface of the metal plate, and the heating pattern disposed on the first insulation layer;

wherein the first terminal is disposed on the heating pattern; and wherein the fixing member is coupled to the second cover to be disposed on the first terminal.

7. The fluid heating heater of claim 6, wherein the main body includes a second sidewall portion disposed at the other surface of the partition part and to which the second cover is coupled.

8. The fluid heating heater of claim 7, wherein:

the first terminal includes a first-first horizontal portion disposed on the heating pattern, a first vertical portion bent from the first-first horizontal portion in a direction vertical to the other surface of the metal plate, and a first-second horizontal portion bent from the first vertical portion in a direction opposite the first-first horizontal portion;

the fixing member is disposed on the first-first horizontal portion; and the first-second horizontal portion is disposed on the second terminal.

9. The fluid heating heater of claim 8, wherein:

the second terminal includes a second vertical portion inserted into a slot of the circuit board, a second horizontal portion facing the first-second horizontal portion, and a connection part bent from the second vertical portion and the second horizontal portion; and the connection part is disposed to be inclined with respect to the second vertical portion and the second horizontal portion.

10. The fluid heating heater of claim 7, wherein:

a plurality of heating patterns are disposed in parallel;

at least one first terminal is disposed on each of the plurality of heating patterns;

one fixing member is disposed on the plurality of first terminals, and the fixing member includes an elastic layer disposed on an end portion to compensate for a difference of heights of the plurality of first terminals;

one second terminal is disposed on each of the plurality of first terminals;

the bus bar includes a bus bar frame to which the plurality of second terminals are coupled; and the bus bar frame includes a plurality of protruding parts respectively inserted into a plurality of connection holes configured to pass through the partition part.

11. A fluid heating heater comprising:

a main body including a plate-shaped partition part, and a flow path forming part forming a flow path in the other surface of the partition part;

a heating plate disposed on the flow path forming part in a plate shape, and including a heating pattern having a shape corresponding to the flow path;

a circuit board disposed on one surface of the partition part to control heat generation of the heating pattern; and a bus bar configured to electrically connect the heating pattern and the circuit board;

wherein the bus bar includes a terminal disposed on the heating pattern to be connected to the circuit board, and a bus bar frame fixed to the heating plate to prevent the terminal from separating from the heating pattern;

the bus bar frame includes a frame main body configured to surround the vertical portion, and a cantilever configured to horizontally extend from the frame main body to be disposed on the second horizontal portion; and the cantilever presses the second horizontal portion toward the heating pattern.

12. The fluid heating heater of claim 11, wherein:

the terminal includes a vertical portion having one end connected to the circuit board, a first horizontal portion configured to horizontally extend from the other end of the vertical portion, a second horizontal portion disposed on an end portion of the heating pattern, and a connection part bent from the first horizontal portion and the second horizontal portion;

the connection part is disposed to be inclined with respect to the first horizontal portion and the second horizontal portion.

13. The fluid heating heater of claim 12, wherein the cantilever includes a first area configured to surround the first horizontal portion, a second area in which a groove configured to expose the connection part is formed, and a third area disposed on the second horizontal portion, and is disposed on the heating plate at the first area.

14. The fluid heating heater of claim 13, wherein the cantilever has a smaller thickness at the second area in comparison with the first area and the third area.

15. The fluid heating heater of claim 12, wherein a plurality of fastening holes into which fastening members fastened to the heating plate are inserted are formed in the frame main body.

* * * * *